(12) United States Patent
Nakatani (10) Patent No.: US 10,700,185 B2
(45) Date of Patent: Jun. 30, 2020

(54) SEMICONDUCTOR DEVICE

(71) Applicant: Mitsubishi Electric Corporation, Tokyo (JP)

(72) Inventor: Takahiro Nakatani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/181,576

(22) Filed: Nov. 6, 2018

(65) Prior Publication Data

US 2019/0237567 A1 Aug. 1, 2019

(30) Foreign Application Priority Data

Jan. 26, 2018 (JP) .................................. 2018-011151

(51) Int. Cl.
| | |
|---|---|
| *H01L 29/739* | (2006.01) |
| *H01L 29/06* | (2006.01) |
| *H01L 29/417* | (2006.01) |
| *H01L 29/423* | (2006.01) |
| *H01L 29/66* | (2006.01) |

(52) U.S. Cl.
CPC ...... *H01L 29/7397* (2013.01); *H01L 29/0696* (2013.01); *H01L 29/417* (2013.01); *H01L 29/42376* (2013.01); *H01L 29/66348* (2013.01)

(58) Field of Classification Search
None
See application file for complete search history.

(56) References Cited

U.S. PATENT DOCUMENTS

| | | | |
|---|---|---|---|
| 2003/0141514 A1* | 7/2003 | Yamaguchi | ....... H01L 29/66348 257/107 |
| 2006/0163649 A1 | 7/2006 | Otsuki | |
| 2016/0293751 A1* | 10/2016 | Siemieniec | ........... H01L 29/404 |
| 2017/0005171 A1* | 1/2017 | Laforet | ................. H01L 29/404 |

FOREIGN PATENT DOCUMENTS

JP 2006-210547 A 8/2006

* cited by examiner

*Primary Examiner* — Grant S Withers
(74) *Attorney, Agent, or Firm* — Studebaker & Brackett PC

(57) ABSTRACT

Trenches each have longer sides extending in a longitudinal direction, and shorter sides linking the longer sides together. The trenches are periodically arranged in the longitudinal direction and a transverse direction. A first region is on a drift layer of a first conductivity type, has a second conductivity type, and is penetrated by the trenches. A second region is on the first region so as to be away from the drift layer, has the first conductivity type, and is in contact with the longer sides of each of the trenches so as to be away from the ends of the longer sides. A third region is on the first region, has the second conductivity type, and has a higher impurity concentration than the first region. The gate electrode is in the trench with a gate insulating film interposed therebetween.

13 Claims, 8 Drawing Sheets

SEMICONDUCTOR DEVICE

BACKGROUND OF THE INVENTION

Field of the Invention

The present invention relates to semiconductor devices, and particularly, to a power semiconductor device having a gate electrode insulated from a semiconductor substrate.

Description of the Background Art

Worldwide energy saving boosts a great hope for low power consumption in power converters. Power devices are key components in the power converters. Among the power devices, insulated-gate bipolar transistors (IGBTs) are currently widely used. In particular, a trench IGBT, which has channels at high density, tends to receive a low ON-voltage (the details of which will be described later on). The trench IGBT is thus suitable for reducing power consumption. The following describes one example of the configuration and operation of an IGBT having a trench gate structure.

To achieve the configuration of the IGBT, a silicon wafer is prepared that has a $p^+$ silicon substrate and an $n^-$ drift layer disposed on the upper surface of the $p^+$ silicon substrate. A p base region is formed in a surface layer of the $n^-$ drift layer. $N^+$ emitter regions are selectively formed in a surface layer of the p base region. Formed in striped form are trenches extending from a surface of the $n^+$ emitter region through the p base region to the $n^-$ drift layer. A gate electrode made of polycrystalline silicon is filled inside each trench with a gate oxide film interposed therebetween. An interlayer insulating film is formed over the upper part of the gate electrode. A sheet of emitter electrode is disposed in the upper part of the interlayer insulating film so as to be in contact with the $n^+$ emitter region and the p base region. A sheet of collector electrode is disposed on the lower surface of the $p^+$ silicon substrate.

A high positive electrode is applied to the collector electrode with the potential of the emitter electrode set as a base. The IGBT is OFF while the voltage at the gate electrode is lower than a threshold. To turn on the IGBT, a voltage higher than the threshold is applied from a gate drive circuit to the gate electrode via a gate resistor. Accordingly, electric charges accumulate in the gate electrode. This accumulation causes the conductivity type of a portion in the p base region, the portion facing the gate electrode with the gate oxide film interposed therebetween, to be reversed into an n-type. As a result, a channel region is formed in part of the p base region. Accordingly, electronic current is supplied to the $n^-$ drift layer from the emitter electrode through the $n^+$ emitter region and the channel region of the p base region. The electrons as supplied establish a forward-bias state between the $p^+$ silicon substrate and the $n^-$ drift layer. Consequently, holes can be injected from the collector electrode. This turns on the IGBT. A voltage drop between the emitter electrode and the collector electrode while the IGBT is ON is an ON-voltage.

To switch the IGBT from an ON state to an OFF state, the voltage between the emitter electrode and the gate electrode is equal to or less than a threshold. Accordingly, the charges that have been accumulated in the gate electrode discharge to the gate drive circuit via the gate resistor. At this time, the channel region in the p base region, which is a region whose conductivity type has been reversed into an n-type, turns back to a p-type. Accordingly, the channel region vanishes. As a result, the electron supply to the $n^-$ drift layer stops. The hole injection also stops accordingly. Then, the electrons and the holes that have been accumulated in the $n^-$ drift layer are ejected to the collector electrode and the emitter electrode, respectively, or the electrons and the holes rejoin to each other, thus vanishing current. That is, the IGBT is turned off.

As earlier described, the switching between ON and OFF states requires the charge and discharge of the capacitance between the gate electrode and the emitter electrode. A large capacitance consumes time necessary for charge and discharge for switching operation, to thus increase power losses in the IGBT. The total losses in the power device include not only steady losses determined by the ON-voltage, but also switching losses between the ON and OFF states. Thus, total-loss reduction requires not only steady-loss reduction, but also switching-loss reduction. To do this, lowering the capacitance is important.

Japanese Unexamined Patent Application Publication No. 2006-210547 describes an IGBT having trenches in striped form. Semiconductor regions, i.e., mesa regions, extending between the trenches have p base regions. Each p base region is, in plan view, divided into a plurality portions separated from one another. Each divided portion of the p base region is provided with an $n^+$ emitter region. The publication discusses that the capacitance between the gate and the emitter is lowered because regions in which gate electrodes face emitter structures are reduced.

According to the technique described in the publication, the reduction in the regions having the emitter structures involves a sacrifice—an increase in ON-voltage, which leads to an increase in steady loss. If the capacitance were lowered to a sufficiently large degree compared to this sacrifice, the switching loss reduction would be sufficiently larger than the increase in steady loss, thereby sufficiently reducing the total losses. However, the present inventor has studied to find that the technique in the publication fails to sufficiently lower the capacitance associated with a portion in the gate electrode, the portion making no contribution to the formation of the channel region, thus failing to sufficiently reduce the switching losses.

SUMMARY

To solve the problem, it is an object of the present invention to provide a semiconductor device that reduces switching losses while avoiding a large increase in ON-voltage, thereby reducing total losses.

A semiconductor device according to one aspect of the present invention includes a semiconductor substrate, an insulating film, a plurality of gate electrodes, a first main electrode, and a second main electrode. The semiconductor substrate has a first surface provided with a plurality of trenches, and a second surface opposite the first surface. The plurality of trenches each have an opening on the first surface. The opening has a pair of longer sides extending in a longitudinal direction, and a pair of shorter sides linking the pair of longer sides to each other. The plurality of trenches are periodically arranged in the longitudinal direction and a transverse direction crossing the longitudinal direction. The semiconductor substrate includes a drift layer, a first region, a second region, and a third region. The drift layer has a first conductivity type. The first region is disposed on the drift layer, has a second conductivity type different from the first conductivity type, and is penetrated by the plurality of trenches. The second region is disposed on the first region so as to be away from the drift layer, has the first conductivity type, has an impurity concentration higher than the impurity concentration of the drift layer, and is in contact with the pair of longer sides of each of the plurality of trenches so as to be away from the ends of the pair of longer sides. The third region is disposed on the first region, has the second conductivity type, and has an impurity concentration higher than the impurity concentration of the first region. The insulating film covers the inner surfaces of the plurality of trenches. The plurality of gate electrodes are individually disposed in the plurality of trenches with the insulating film interposed therebetween. The first main electrode is disposed on the first surface of the semiconductor substrate, is away from the drift layer, and is in contact with the second region and the third region. The second main electrode is disposed on the second surface of the semiconductor substrate.

A semiconductor device according to another aspect of the present invention includes a semiconductor substrate, an insulating film, a plurality of gate electrodes, a first main electrode, and a second main electrode. The semiconductor substrate has a first surface provided with a plurality of trenches, and a second surface opposite the first surface. The plurality of trenches each have an opening on the first surface. The opening has a pair of longer sides extending in a longitudinal direction, and a pair of shorter sides linking the pair of longer sides to each other. The plurality of trenches are periodically arranged in the longitudinal direction and a transverse direction crossing the longitudinal direction. The semiconductor substrate includes a drift layer, a first region, a second region, and a third region. The drift layer has a first conductivity type. The first region is disposed on only part of the drift layer, has a second conductivity type different from the first conductivity type, and is penetrated by the plurality of trenches. The second region is disposed on the first region so as to be away from the drift layer, has the first conductivity type, has an impurity concentration higher than the impurity concentration of the drift layer, and is in contact with the pair of longer sides of each of the plurality of trenches. The third region is disposed on the first region, has the second conductivity type, and has an impurity concentration higher than the impurity concentration of the first region. The insulating film covers the inner surfaces of the plurality of trenches. The plurality of gate electrodes are individually disposed in the plurality of trenches with the insulating film interposed therebetween. The first main electrode is disposed on the first surface of the semiconductor substrate, is away from the drift layer, and is in contact with the second region and the third region. The second main electrode is disposed on the second surface of the semiconductor substrate.

According to the one aspect of the present invention, the plurality of trenches are discretely arranged in the longitudinal direction. Such a discrete arrangement downsizes the area in which the gate electrode in the trench faces the semiconductor substrate, when compared to a non-discrete arrangement. This lowers the capacitance between the gate electrode and the emitter electrode. Further, the second region is away from the ends of the pair of longer sides of each of the plurality of trenches. Consequently, the second region is provided so as to be away from the pair of shorter sides of each of the plurality of trenches. This prevents the second region, which has a higher impurity concentration and has the first conductivity type, from forming a pn junction. As a result, capacitance formation resulting from the pn junction is prevented. This lowers the capacitance between the gate electrode and the emitter electrode. Lowering the capacitance in this way reduces the switching losses while avoiding the large increase in ON-voltage. This reduces the total losses in the semiconductor device.

According to the other aspect of the present invention, the plurality of trenches are discretely arranged in the longitudinal direction. Such a discrete arrangement downsizes the area in which the gate electrode in the trench faces the semiconductor substrate, when compared to a non-discrete arrangement. This lowers the capacitance between the gate electrode and the emitter electrode. Further, the first region is disposed on only part of the drift layer. Such a structure downsizes the area of the pn junction between the first region and the drift layer, when compared to a structure in which the first region is disposed all over the drift layer. As a result, capacitance formation resulting from the pn junction is prevented. This lowers the capacitance between the gate electrode and the emitter electrode. Lowering the capacitance in this way reduces the switching losses while avoiding the large increase in ON-voltage. This reduces the total losses in the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiments of the present invention will be described with reference to the drawings. The preferred embodiments detail an instance where a first conductivity type is an n-type, and a second conductivity type, different from the first conductivity type, is a p-type. Such conductivity-type selection is commonly preferable. Nevertheless, the first conductivity type may be a p-type, and the second conductivity type may be an n-type.

First Preferred Embodiment (Structure)

Figure 1:
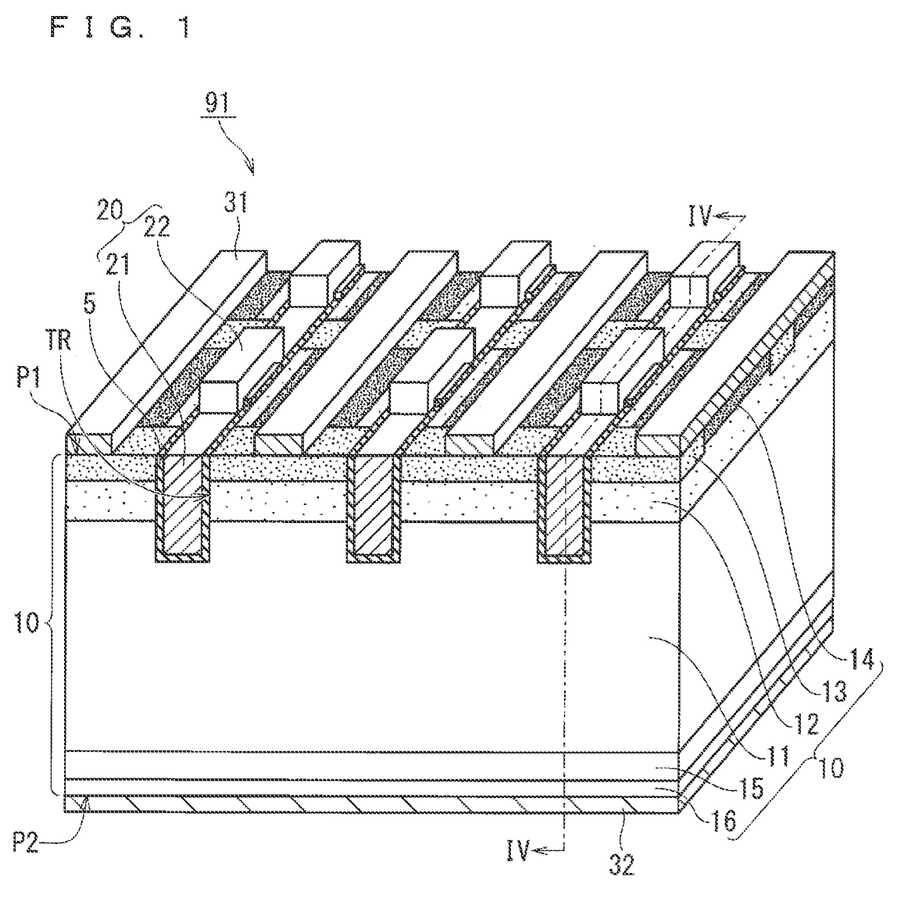
FIG. 1 is a schematic partial perspective view of the configuration of an active region of a semiconductor device according to a first preferred embodiment of the present invention.
Figure 2:
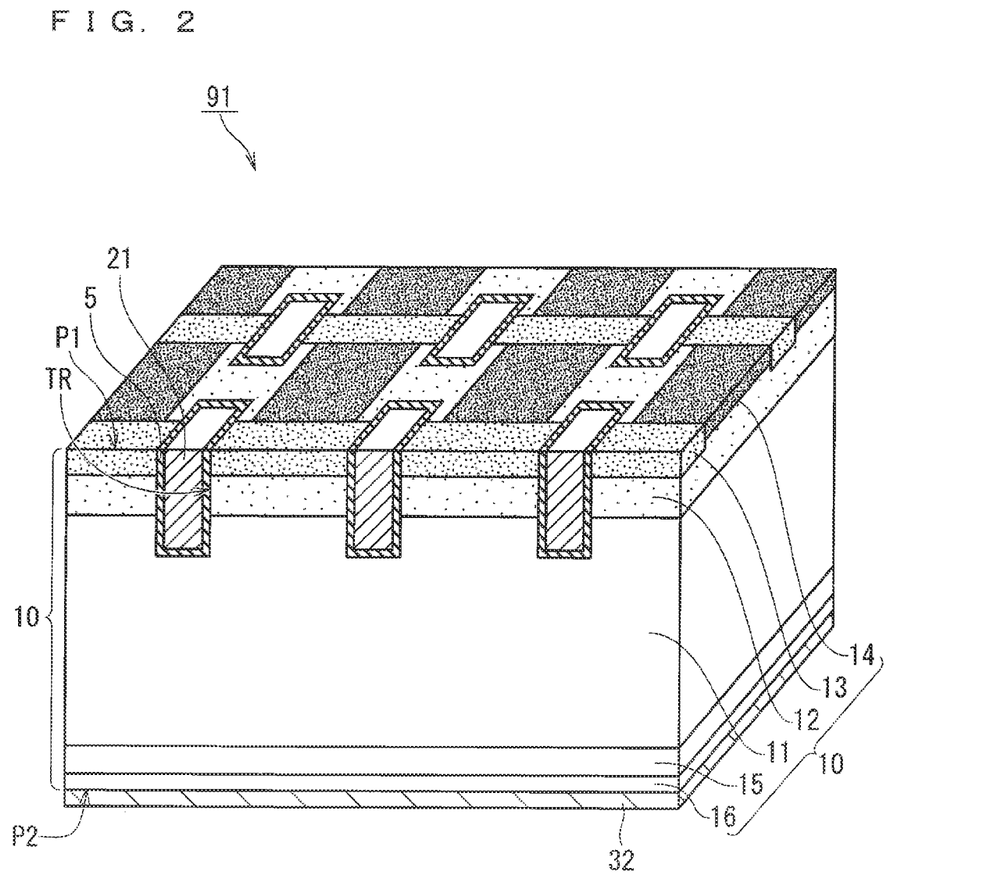
FIG. 2 is a partial perspective view of the configuration of the semiconductor device according to the first preferred embodiment of the present invention with the illustration of the configuration in FIG. 1 partly omitted.
Figure 3:
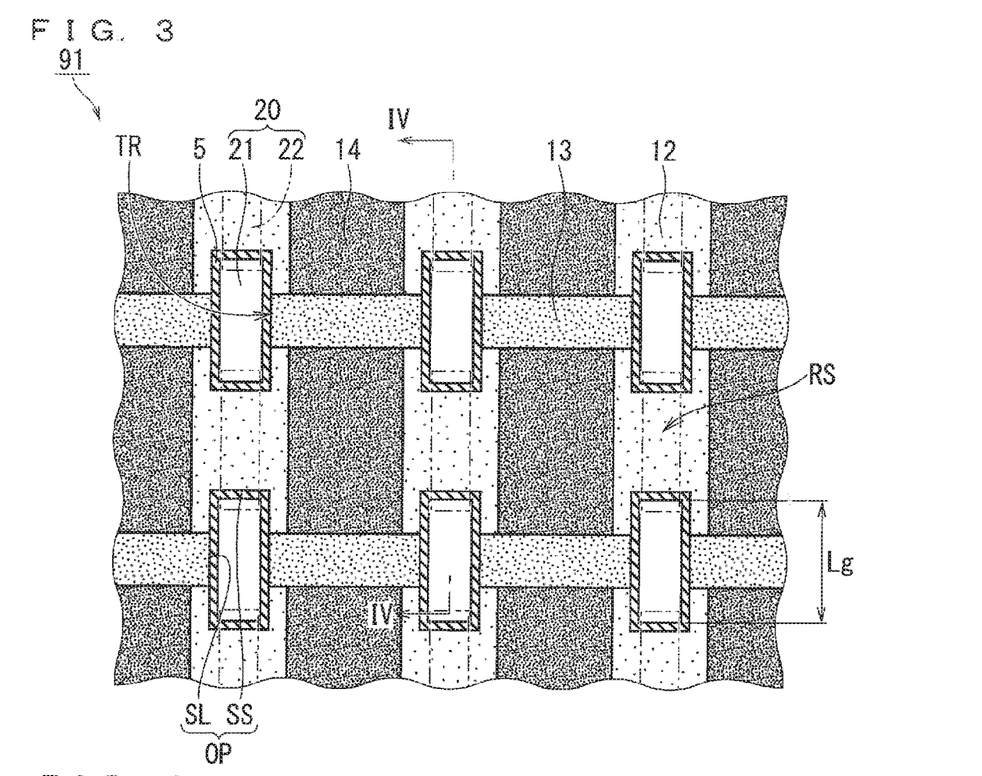
FIG. 3 is a partial plan view of the upper surface in FIG. 2.
Figure 4:
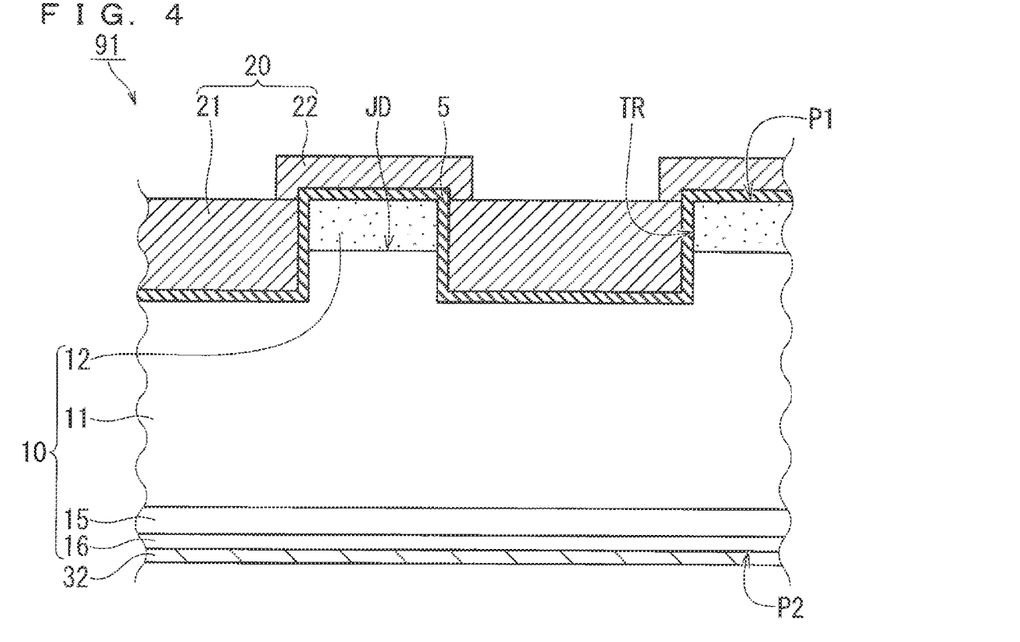
FIG. 4 is a partial cross-sectional view taken along line IV-IV in FIG. 1.

FIG. 1 is a schematic partial perspective view of the configuration of an active region of an IGBT 91 (semiconductor device) according to a first preferred embodiment. For clarity, FIG. 1 does not show a gate insulating film 5 on a flat portion of the upper surface P1 of a semiconductor substrate 10. FIG. 2 is a partial perspective view of the configuration of the IGBT 91 with the illustration of the configuration above a plane including the flat portion omitted. FIG. 3 is a partial plan view of the upper surface in FIG. 2. FIG. 4 is a partial cross-sectional view taken along line IV-IV in FIG. 1.

The IGBT 91 in the first preferred embodiment includes the semiconductor substrate 10, the gate insulating film 5 (insulating film), gate electrodes 21, an emitter electrode 31 (first main electrode), and a collector electrode 32 (second main electrode). The IGBT 91 may include connection electrodes 22. The semiconductor substrate 10 has the upper surface P1 (first surface) and a lower surface P2 (second surface opposite the first surface). The semiconductor substrate 10 is made of, for instance, silicon.

The upper surface P1 is provided with trenches TR. Each trench TR has an opening OP (FIG. 3) on the upper surface P1. The opening OP has a pair of longer sides SL extending in a longitudinal direction, and a pair of shorter sides SS linking the pair of longer sides SL to each other. The trenches TR are periodically arranged in the longitudinal direction and a transverse direction that crosses the longitudinal direction. The transverse direction is preferably a direction orthogonal to the longitudinal direction, that is, an orthogonal direction. In the example illustrated in FIGS. 1 to 4, the trenches TR have patterns formed in such a manner that straight-line patterns arranged in striped form are partly lacking. To be specific, each straight-line pattern is lacking in some locations in a direction where the straight-line pattern extends, thus being divided into portions separated from one another. In other words, the trenches TR are selectively disposed in only part of the straight-line patterns arranged in striped form in the direction where the straight-line patterns extend. As illustrated in FIG. 3, the shorter sides SS as well as the longer sides SL may be straight lines. In this case, the opening OP may have a rectangular shape.

The semiconductor substrate 10 includes a drift layer 11, a p-type base region 12 (first region), an n-type emitter region 13 (second region), a p-type contact region 14 (third region), and a p-type collector layer 16 (semiconductor layer). The semiconductor substrate 10 may further include an n-type buffer layer 15.

The p-type base region 12 is disposed on the drift layer 11. In the present preferred embodiment, the p-type base region 12 may be disposed all over the drift layer 11 in the active region. The p-type base region 12 is penetrated by the trenches TR reaching the drift layer 11.

The n-type emitter region 13 is disposed on the p-type base region 12 so as to be away from the drift layer 11. The n-type emitter region 13 is in contact with the pair of longer sides SL of each trench TR so as to be away from the ends of the pair of longer sides SL. The n-type emitter region 13 may be away from the pair of shorter sides SS of each trench TR. The n-type emitter region 13 has an impurity concentration higher than that of the drift layer 11.

The p-type contact region 14 is disposed on the p-type base region 12. The p-type contact region 14 has an impurity concentration higher than that of the p-type base region 12.

The p-type collector layer 16 constitutes at least part of the lower surface P2, and is in contact with the collector electrode 32 on the lower surface P2. The p-type collector layer 16 is disposed on the lower surface of the drift layer 11 with the n-type buffer layer 15 interposed therebetween. The n-type buffer layer 15 has an impurity concentration higher than that of the drift layer 11. It is noted that the n-type buffer layer 15 may be omitted.

The gate insulating film 5 covers the inner surfaces of the trenches TR. The gate insulating film 5 may further cover, in part, the upper surface P1 of the semiconductor substrate 10 outside the trenches TR.

The gate electrodes 21 are individually disposed in the trenches TR with the gate insulating film 5 interposed therebetween. The gate electrodes 21 are each in contact with the n-type emitter region 13 and the p-type base region 12 with the gate insulating film 5 interposed therebetween in the trench TR. The emitter electrode 31 is disposed on the upper surface P1 of the semiconductor substrate 10. The emitter electrode 31 is away from the drift layer 11, and in contact with the n-type emitter region 13 and the p-type contact region 14. The collector electrode 32 is disposed on the lower surface P2 of the semiconductor substrate 10.

The gate electrodes 21 are each preferably have a length Lg of 3 μm or more and 4 μm or less along the longitudinal direction. The n-type emitter region 13 is preferably separated into portions in the longitudinal direction (vertical direction in FIG. 3); moreover, the center of each portion is located in the same position as the center of the length Lg in the longitudinal direction.

The IGBT 91 may further include the connection electrodes 22 connecting adjacent ones of the gate electrodes 21 in the longitudinal direction to each other. In this case, as illustrated in FIG. 4, the gate insulating film 5 has portions separating the connection electrodes 22 from the upper surface P1 of the semiconductor substrate 10. The gate electrodes 21 and the connection electrodes 22 constitute a compound electrode 20. The compound electrode 20 may have straight-line patterns arranged in striped form in plan view (FIG. 3). The connection electrodes 22 are preferably made of the same material as the gate electrodes 21.

Figure 5:
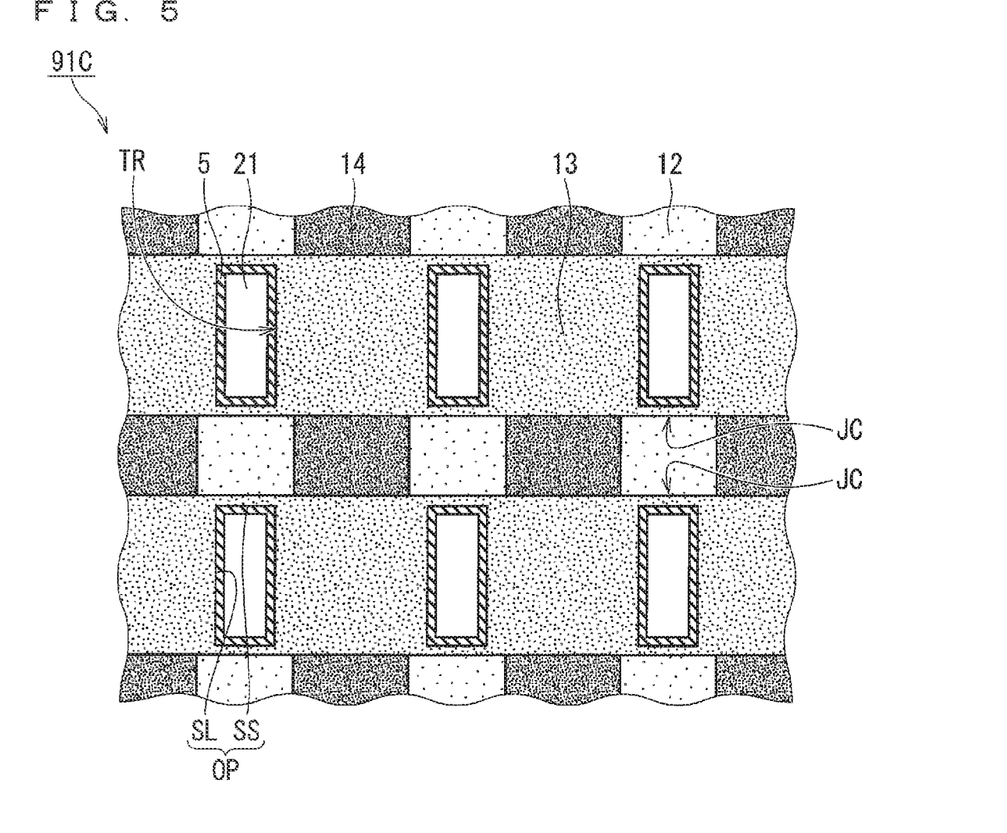
FIG. 5 is a partial plan view of the configuration of a semiconductor device according to a comparative example in a field of view similar to that in FIG. 3.

In the IGBT 91, only a semiconductor region having a p-type is disposed in a region RS (FIG. 3) between adjacent ones of the trenches TR in the longitudinal direction. To be specific, the p-type base region 12 is provided as this semiconductor region. Meanwhile, in an IGBT 91C in a comparative example (FIG. 5), the n-type emitter region 13 is disposed in part of a region corresponding to the region RS (FIG. 3). As a result, a pn junction JC at which a p-type region faces an n-type region in an in-plane direction is formed in the region corresponding to the region RS (FIG. 3). Capacitance formation resulting from the pn junction JC increases the capacitance between the gate electrode 21 and the emitter electrode 31. Consequently, the IGBT 91C in the comparative example involves increased switching losses.

It is noted that a voltage-resistant structure (not shown) may be disposed in a region outside the active region (FIGS. 1 to 4) of the IGBT 91, typically, in an outer-periphery region. The voltage-resistant structure is composed of, for instance, a combination of a guard ring, a field plate, and a RESURF.

(Simulation)

Figure 6:
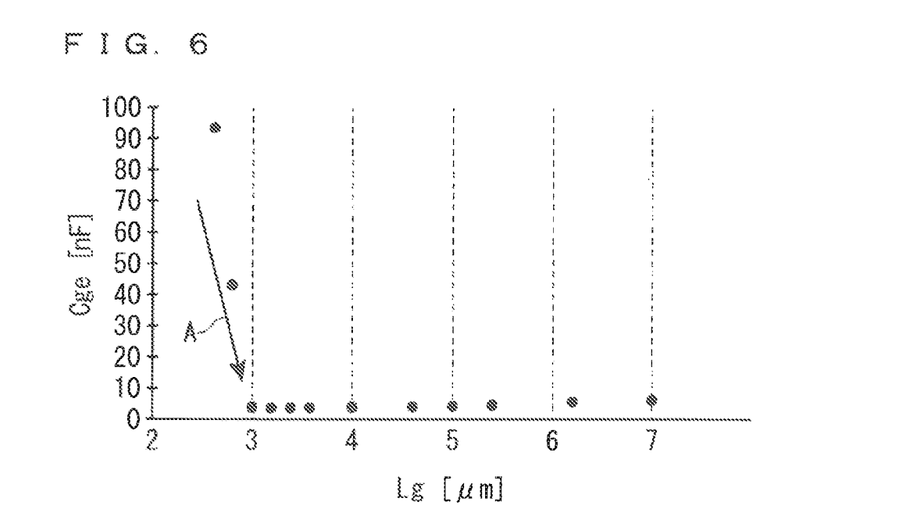
FIG. 6 is a graph showing the relationship between the length Lg of a gate electrode and the capacitance Cge between the gate electrode and an emitter electrode, in the preferred embodiment.
Figure 7:
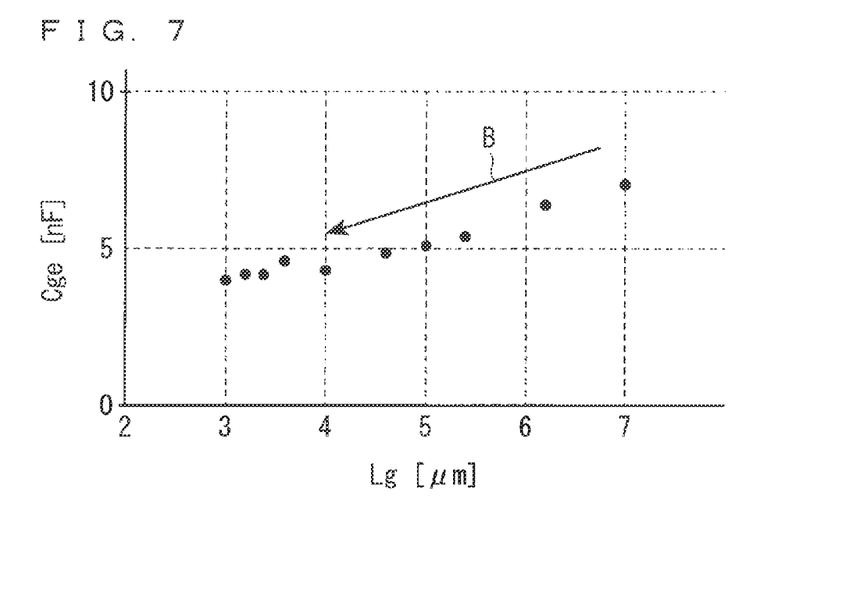
FIG. 7 is an enlarged graph of part of FIG. 6.

FIG. 6 is a graph showing an example of a simulation of the relationship between the length Lg (FIG. 3) of the gate electrode 21 and the capacitance Cge between the gate electrode 21 and the emitter electrode 31, in the preferred embodiment. FIG. 7 is an enlarged graph of part of the vertical axis in FIG. 6. As indicated by arrow A (FIG. 6), a length Lg of 3 μm or more noticeably lowers the capacitance Cge. Further, as indicated by arrow B (FIG. 7), a length Lg of 4 μm or less lowers the capacitance Cge. The lowered capacitance Cge shortens time for electric-charge accumulation in the gate electrode 21 during switching operation. This reduces switching losses.

Figure 8:
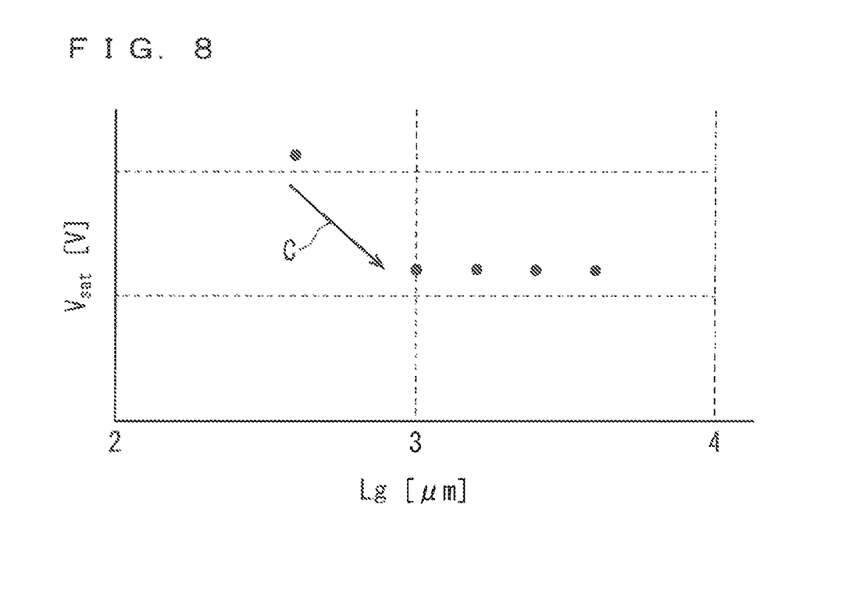
FIG. 8 is a graph showing the relationship between the length Lg of the gate electrode and saturation voltage Vsat in the preferred embodiment.

FIG. 8 is a graph showing the relationship between the length Lg of the gate electrode 21 and saturation voltage Vsat in the preferred embodiment. In the drawing, as indicated by arrow C, a length Lg of 3 μm or more reduces the saturation voltage Vsat (ON-voltage). This reduces steady losses in the IGBT.

These simulation results have revealed that a length Lg of 3 μm or more and 4 μm or less sufficiently reduces the switching losses while avoiding a large increase in ON-voltage.

(Manufacture Method)

The following described one example of how to manufacture the IGBT 91. First, prepared is the semiconductor substrate 10 of n-type that includes a portion constituting the drift layer 11.

Next, formed is a structure on the upper surface P1 of the semiconductor substrate 10. To be specific, various impurities are selectively doped to the surface layer of the upper surface P1 of the semiconductor substrate 10 through ion implantation. This forms the p-type base region 12, the n-type emitter region 13, and the p-type contact region 14. Subsequently, the upper surface P1 of the semiconductor substrate 10 undergoes selective etching to form the trenches TR. Then, the insulating film is formed on the upper surface P1 having trenches TR, through, for instance, thermal oxidation. Next, formed on the insulating film is polycrystalline silicon through, for instance, chemical vapor deposition (CVD). The insulating film and polycrystalline silicon undergo patterning through photolithography and etching to thus form the gate insulating film 5 and the compound electrode 20. Then, the emitter electrode 31 is selectively formed so as to be in contact with the n-type emitter region 13 and the p-type contact region 14.

Subsequently, formed is a structure on the lower surface P2 of the semiconductor substrate 10. To be specific, the lower surface P2 of the semiconductor substrate 10 undergoes polishing or etching to thus reduce the thickness of the semiconductor substrate 10. Then, the n-type buffer layer 15 and the p-type collector layer 16 are formed through ion implantation to the lower surface P2. Subsequently, stacked films of, for instance, Al/Ti/Ni/Au are formed on the lower surface P2 of the semiconductor substrate 10 as the collector electrode 32 through sputtering.

This provides the IGBT 91.

(Effect)

According to the first preferred embodiment, the trenches TR are discretely arranged in the longitudinal direction (vertical direction in FIG. 3). Such a discrete arrangement downsizes the area in which the gate electrode 21 in the trench TR faces the semiconductor substrate 10 with the gate insulating film 5 interposed therebetween when compared to a non-discrete arrangement. This lowers the capacitance Cge between the gate electrode 21 and the emitter electrode 31. Further, the n-type emitter region 13 is away from the ends of the pair of longer sides SL of each trench TR. Consequently, the n-type emitter region 13 is provided so as to be away from the pair of shorter sides SS (FIG. 3) of each trench TR. This prevents the n-type emitter region 13 having an n-type and a high impurity concentration from forming the pn junction JC (FIG. 5) near the shorter side SS, thereby preventing capacitance formation resulting from the pn junction JC. This further lowers the capacitance Cge between the gate electrode 21 and the emitter electrode 31. Lowering the capacitance Cge in this way reduces the switching losses while avoiding the large increase in ON-voltage. This reduces total losses in the IGBT.

Only a semiconductor region having the p-type is disposed between the adjacent ones of the trenches TR in the longitudinal direction (vertical direction in FIG. 3); to be specific, only the p-type base region 12 is disposed. This prevents the pn junction from being formed between the adjacent ones of the trenches TR in the longitudinal direction. Consequently, the capacitance formation resulting from the pn junction is prevented, thereby further lowering the capacitance Cge between the gate electrode 21 and the emitter electrode 31.

The gate electrodes 21 each preferably have a length Lg of 3 μm or more and 4 μm or less along the longitudinal direction. In this case, as illustrated in FIGS. 6 and 7, the capacitance Cge between the gate electrode 21 and the emitter electrode 31 is lowered with more certainty. In addition, as illustrated in FIG. 8, the saturation voltage (ON-voltage) is lowered with more certainty.

The connection electrodes 22 (FIG. 1) connect the adjacent ones of the gate electrodes 21 in the longitudinal direction to each other. Accordingly, the adjacent ones of the gate electrodes 21 in the longitudinal direction have potentials that are almost uniform. This prevents property variations in the IGBT 91. The connection electrodes 22, when made of the same material as the gate electrodes 21, are formed through simplified steps.

Second Preferred Embodiment (Structure)

Figure 9:
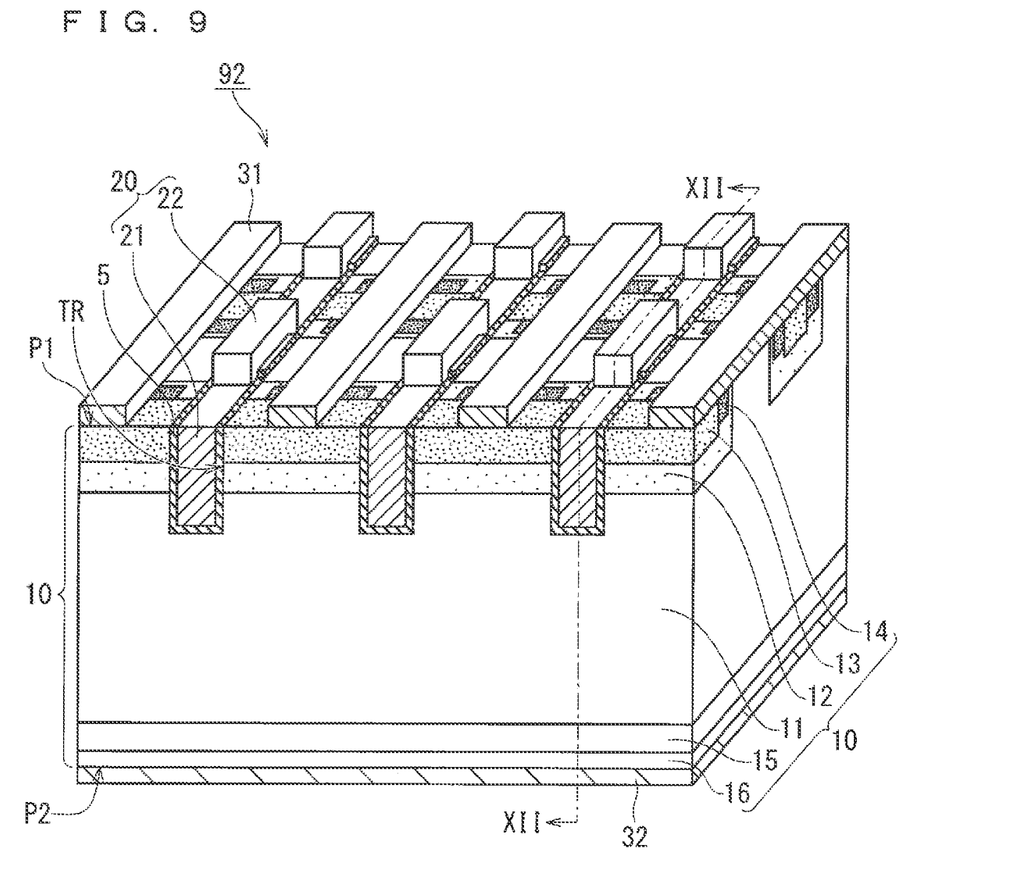
FIG. 9 is a schematic partial perspective view of the configuration of an active region of a semiconductor device according to a second preferred embodiment of the present invention.
Figure 10:
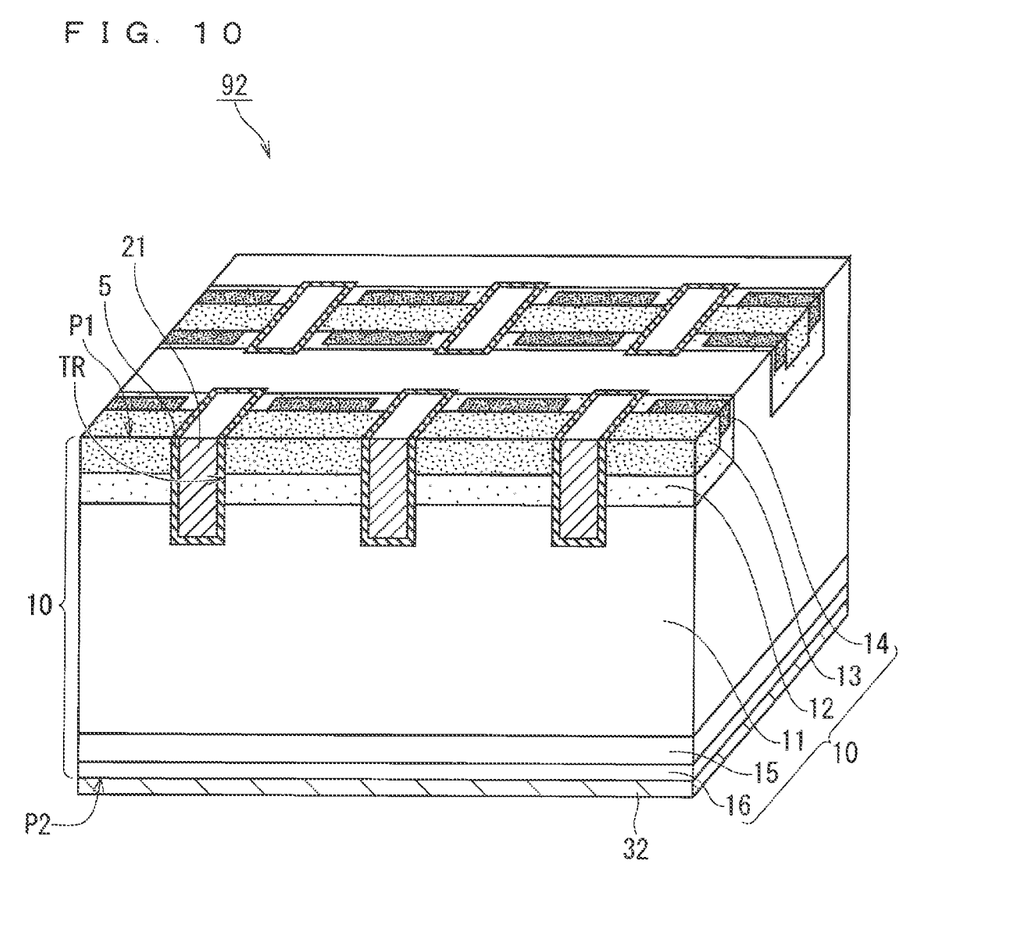
FIG. 10 is a partial perspective view of the configuration of the semiconductor device according to the second preferred embodiment of the present invention with the illustration of the configuration in FIG. 9 partly omitted.
Figure 11:
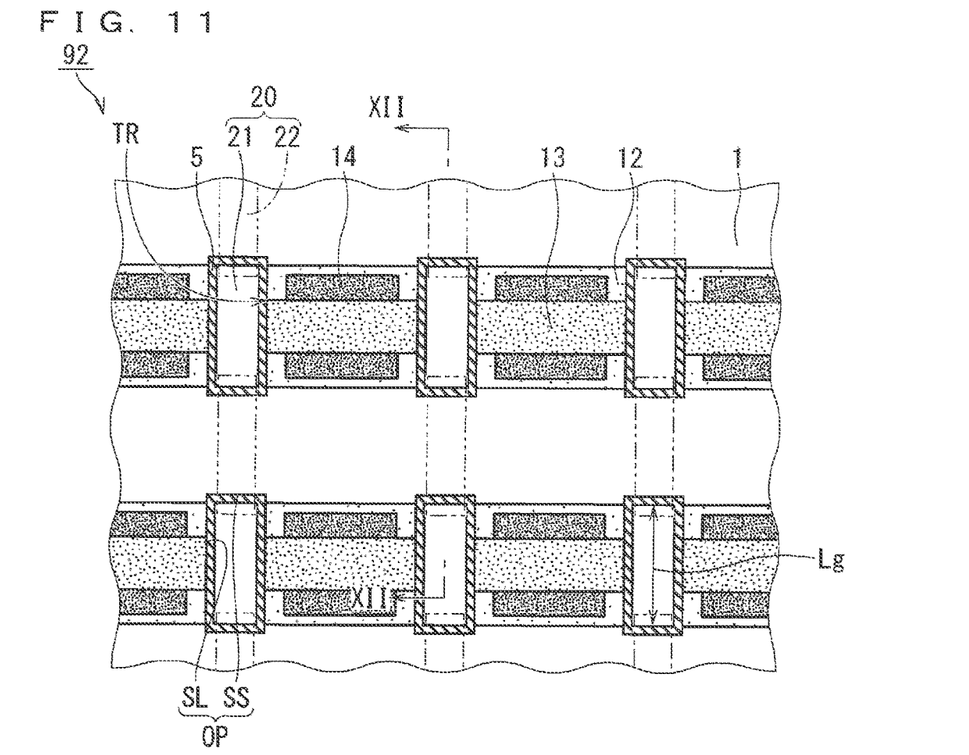
FIG. 11 is a partial plan view of the upper surface in FIG. 10.
Figure 12:
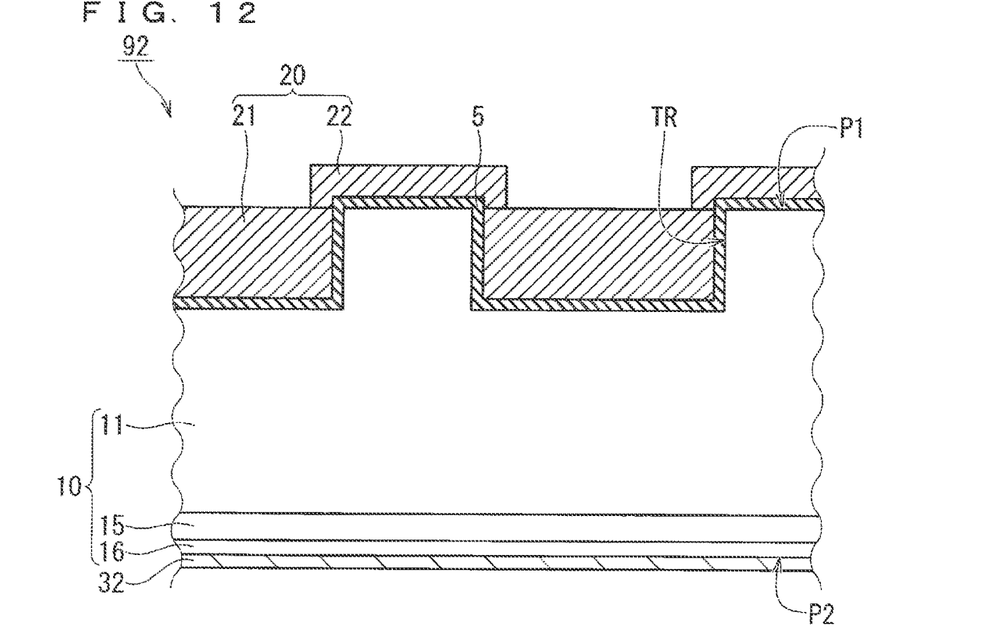
FIG. 12 is a partial cross-sectional view taken along line XII-XII in FIG. 9.

FIG. 9 is a schematic partial perspective view of the configuration of an active region of an IGBT 92 (semiconductor device) according to a second preferred embodiment of the present invention. For clarity, FIG. 9 does not show the gate insulating film 5 on the flat portion of the upper surface P1 of the semiconductor substrate 10. FIG. 10 is a partial perspective view of the configuration of the IGBT 92 with the illustration of the configuration above a plane including the flat portion omitted. FIG. 11 is a partial plan view of the upper surface in FIG. 10. FIG. 12 is a partial cross-sectional view taken along line XII-XII in FIG. 9.

In the IGBT 92 (semiconductor device) according to the second preferred embodiment, the p-type base region 12 is disposed on only part of the drift layer 11 in the active region. The p-type base region 12 may be separated into portions in a longitudinal direction (vertical direction in FIG. 11). The p-type base region 12 may be in contact with part of the pair of longer sides SL (FIG. 11) of each trench TR, and may be away from the pair of shorter sides SS (FIG. 11) of each trench TR. The p-type base region 12 may be disposed only between adjacent ones of the trenches TR in a transverse direction (lateral direction in FIG. 11). In the active region, a portion of the upper surface P1, the portion not being provided with the p-type base region 12 on the drift layer 11, may be formed of the drift layer 11.

The other configuration is almost the same as that in the first preferred embodiment. Accordingly, identical or corresponding components are denoted by the same signs, and will not be elaborated upon here.

(Effect)

According to the second preferred embodiment, the trenches TR are discretely arranged in the longitudinal direction (vertical direction in FIG. 11). Such a discrete arrangement downsizes the area in which the gate electrode 21 in the trench TR faces the semiconductor substrate 10 with the gate insulating film 5 interposed therebetween when compared to a non-discrete arrangement. This lowers the capacitance Cge between the gate electrode 21 and the emitter electrode 31. Further, the p-type base region 12 is disposed on only part of the drift layer 11 in the active region. Such a structure downsizes the area of a pn junction formed by the p-type base region 12 facing the drift layer 11 in a thickness direction when compared to a structure in which the p-type base region 12 is disposed all over the drift layer 11. This prevents capacitance formation resulting from the pn junction, thereby further lowering the capacitance Cge between the gate electrode 21 and the emitter electrode 31. Lowering the capacitance Cge in this way reduces switching losses while avoiding a large increase in ON-voltage. This reduces total losses in the IGBT.

The p-type base region 12 may be separated into portions in the longitudinal direction (vertical direction in FIG. 11). Such a structure prevents the pn junction JD (FIG. 4) at which the p-type base region 12 faces the drift layer 11 in the thickness direction from being formed between the portions described above (c.f., FIG. 12).

The p-type base region 12 may be in contact with part of the pair of longer sides SL (FIG. 11) of each trench TR, and may be away from the pair of shorter sides SS (FIG. 11) of each trench TR. Such a structure prevents the pn junction between the p-type base region 12 and the drift layer 11 from being formed near the shorter side SS while forming, on the longer side SL, a path for current flowing through the IGBT 92. As such, establishing a sufficient path for current further lowers the ON-voltage; at the same time, preventing an increase in capacitance resulting from the pn junction further reduces the switching losses.

The p-type base region 12 may be disposed only between the adjacent ones of the trenches TR in the transverse direction (lateral direction in FIG. 11). In this case, the pn junction at which the p-type base region 12 faces the drift layer 11 in the thickness direction has a further reduced area. This further lowers the capacitance resulting from the pn junction.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate including a first surface provided with a plurality of trenches and a second surface opposite the first surface, the plurality of trenches each including, on the first surface, an opening including a pair of longer sides extending in a longitudinal direction and a pair of shorter sides linking the pair of longer sides to each other, the plurality of trenches being periodically arranged in the longitudinal direction and a transverse direction crossing the longitudinal direction, the semiconductor substrate including
      a drift layer having a first conductivity type,
      a first region disposed on the drift layer, having a second conductivity type different from the first conductivity type, and penetrated by the plurality of trenches,
      a second region disposed on the first region so as to be away from the drift layer, having the first conductivity type, having an impurity concentration higher than an impurity concentration of the drift layer, and being in contact with the pair of longer sides of each of the plurality of trenches so as to be away from ends of the pair of longer sides, and
      a third region disposed on the first region, having the second conductivity type, and having an impurity concentration higher than an impurity concentration of the first region;
   an insulating film covering inner surfaces of the plurality of trenches;
   a plurality of gate electrodes individually disposed in the plurality of trenches with the insulating film interposed therebetween;
   a first main electrode disposed on the first surface of the semiconductor substrate, being away from the drift layer, and being in contact with the second region and the third region;
   a second main electrode disposed on the second surface of the semiconductor substrate; and
   a plurality of connection electrodes connecting adjacent ones of the plurality of gate electrodes in the longitudinal direction to each other, wherein
   the insulating film includes portions separating the plurality of connection electrodes from the semiconductor substrate.

2. The semiconductor device according to claim 1, wherein only a semiconductor region having the second conductivity type is disposed between adjacent ones of the plurality of trenches in the longitudinal direction.

3. The semiconductor device according to claim 2, wherein the semiconductor region is the first region.

4. The semiconductor device according to claim 1, wherein the plurality of connection electrodes are made of the same material as the plurality of gate electrodes.

5. The semiconductor device according to claim 1, wherein the plurality of gate electrodes each have a length of 3 µm or more and 4 µm or less along the longitudinal direction.

6. The semiconductor device according to claim 1, wherein the semiconductor substrate further includes a semiconductor layer being in contact with the second main electrode on the second surface, and having the second conductivity type.

7. A semiconductor device comprising:
   a semiconductor substrate including a first surface provided with a plurality of trenches and a second surface opposite the first surface, the plurality of trenches each including, on the first surface, an opening including a pair of longer sides extending in a longitudinal direction and a pair of shorter sides linking the pair of longer sides to each other, the plurality of trenches being periodically arranged in the longitudinal direction and a transverse direction crossing the longitudinal direction, the semiconductor substrate including
      a drift layer having a first conductivity type, a first region disposed on only part of the drift layer, having a second conductivity type different from the first conductivity type, and being penetrated by the plurality of trenches, a second region disposed on the first region so as to be away from the drift layer, having the first conductivity type, having an impurity concentration higher than an impurity concentration of the drift layer, and being in contact with the pair of longer sides of each of the plurality of trenches, and a third region disposed on the first region, having the second conductivity type, and having an impurity concentration higher than an impurity concentration of the first region;

an insulating film covering inner surfaces of the plurality of trenches;

a plurality of gate electrodes individually disposed in the plurality of trenches with the insulating film interposed therebetween;

a first main electrode disposed on the first surface of the semiconductor substrate, being away from the drift layer, and being in contact with the second region and the third region;

a second main electrode disposed on the second surface of the semiconductor substrate; and a plurality of connection electrodes connecting adjacent ones of the plurality of gate electrodes in the longitudinal direction to each other, wherein the insulating film includes portions separating the plurality of connection electrodes from the semiconductor substrate.

8. The semiconductor device according to claim 7, wherein the first region is separated into a plurality of portions in the longitudinal direction.

9. The semiconductor device according to claim 7, wherein the first region is in contact with part of the pair of longer sides of each of the plurality of trenches, and is away from the pair of shorter sides of each of the plurality of trenches.

10. The semiconductor device according to claim 7, wherein the first region is disposed only between adjacent ones of the plurality of trenches in the transverse direction.

11. The semiconductor device according to claim 7, wherein the plurality of connection electrodes are made of the same material as the plurality of gate electrodes.

12. The semiconductor device according to claim 7, wherein the plurality of gate electrodes each have a length of 3 μm or more and 4 μm or less along the longitudinal direction.

13. The semiconductor device according to claim 7, wherein the semiconductor substrate further includes a semiconductor layer being in contact with the second main electrode on the second surface, and having the second conductivity type.

* * * * *